US009696747B1

(12) United States Patent
Tan et al.

(10) Patent No.: US 9,696,747 B1
(45) Date of Patent: Jul. 4, 2017

(54) PROGRAMMABLE REFERENCE VOLTAGE REGULATOR

(71) Applicant: Xilinx, Inc., San Jose, CA (US)

(72) Inventors: Sing-Keng Tan, San Jose, CA (US); Wenyi Song, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/253,566

(22) Filed: Aug. 31, 2016

(51) Int. Cl.
*G05F 3/16* (2006.01)
*H03K 17/687* (2006.01)

(52) U.S. Cl.
CPC ............. *G05F 3/16* (2013.01); *H03K 17/687* (2013.01)

(58) Field of Classification Search
CPC ......... G11C 5/147; G05F 1/465; G05F 3/205; G05F 3/16; H03K 19/0016; H03K 17/687
USPC ........................... 327/530–546; 323/312–317
See application file for complete search history.

(56) References Cited

U.S. PATENT DOCUMENTS 5,216,385 A * 6/1993 McDaniel ................ H03G 3/12 327/537
5,831,845 A 11/1998 Zhou et al.
6,114,843 A 9/2000 Olah
6,288,526 B1 9/2001 Olah
6,559,715 B1 5/2003 Frake et al.
6,661,268 B2 * 12/2003 Stark .................... G11C 7/1051 327/170
6,753,722 B1 6/2004 Kondapalli et al.
7,109,783 B1 9/2006 Kondapalli et al.
7,119,527 B2 * 10/2006 Fernald ................... G05F 3/262 323/313
7,218,168 B1 5/2007 Rahman
7,265,605 B1 9/2007 Vasudevan
7,313,176 B1 12/2007 Groen
7,504,877 B1 3/2009 Voogel et al.
7,667,489 B1 2/2010 Vasudevan
7,733,075 B1 * 6/2010 Vasudevan ............. G11C 5/147 323/314
7,859,918 B1 12/2010 Nguyen et al.
8,710,812 B1 4/2014 Edwards
9,207,695 B2 * 12/2015 Friedman .................. G05F 1/56
2003/0076159 A1 * 4/2003 Shor ........................ G05F 3/242 327/541
2009/0322384 A1 * 12/2009 Oraw ...................... H02M 3/07 327/112
2011/0193545 A1 * 8/2011 Ha ........................ H03F 1/0211 323/315

(Continued)

*Primary Examiner* — Brandon S Cole
(74) *Attorney, Agent, or Firm* — Robert M. Brush

(57) ABSTRACT

An example a voltage regulator includes: a bias circuit coupled to an output node; a first operational amplifier having a first input coupled to the output node, a second input coupled to a reference voltage node, and an output coupled to a first node; a second operational amplifier having a first input coupled to the output node, a second input coupled to the reference voltage node, and an output coupled to a second node; an output transistor coupled between the output node and a ground node, the output transistor including a gate; first, second, and third stacked transistor pairs each serially coupled between the output node and the ground node, each transistor of the first, second, and third stacked transistor pairs including a gate; and switch circuits configured to selectively couple: the gates of the first and second stacked transistor pairs to the second node; and the gate of the output transistor to the first node.

20 Claims, 4 Drawing Sheets

(56) References Cited

U.S. PATENT DOCUMENTS

| | | | | |
|---|---|---|---|---|
| 2012/0077551 | A1* | 3/2012 | Balteanu | G05F 1/56<br>455/572 |
| 2014/0210545 | A1* | 7/2014 | Leibowitz | G05F 1/462<br>327/540 |
| 2017/0041001 | A1* | 2/2017 | Raychowdhury | H03K 19/0016 |
| 2017/0053198 | A1* | 2/2017 | Buescher | G06K 19/0713 |

* cited by examiner

PROGRAMMABLE REFERENCE VOLTAGE REGULATOR

TECHNICAL FIELD

Examples of the present disclosure generally relate to electronic circuits and, in particular, to a programmable reference voltage regulator.

BACKGROUND

In communication systems, a large percentage of the total power is consumed in the transmitter, which must provide for adequate signal swing on a low-impedance channel while maintaining an appropriate source termination. In addition, the transmitter often includes equalization to compensate for frequency-dependent loss in the channel. The driver and pre-driver circuits in the transmitter often consume the majority of the power of the transmitter. A voltage regulator provides a regulated supply voltage to the drivers and pre-drivers. Typically, a voltage regulator sources current from a power supply to the drivers and pre-drivers. The drivers and pre-drivers are coupled between the voltage regulator and an unregulated ground voltage.

SUMMARY

Techniques for providing a programmable reference voltage regulator are described. In an example, a voltage regulator includes: a bias circuit coupled to an output node; a first operational amplifier having a first input coupled to the output node, a second input coupled to a reference voltage node, and an output coupled to a first node; a second operational amplifier having a first input coupled to the output node, a second input coupled to the reference voltage node, and an output coupled to a second node; an output transistor coupled between the output node and a ground node, the output transistor including a gate; first, second, and third stacked transistor pairs each serially coupled between the output node and the ground node, each transistor of the first, second, and third stacked transistor pairs including a gate; and switch circuits configured to selectively couple: the gates of the first and second stacked transistor pairs to the second node; and the gate of the output transistor to the first node.

In another example, a transmitter includes a pre-driver coupled between a first voltage node and a regulated ground voltage node; and a voltage regulator having an output node coupled to regulated ground voltage node. The voltage regulator includes: a bias circuit coupled to the output node; a first operational amplifier having a first input coupled to the output node, a second input coupled to a reference voltage node, and an output coupled to a first node; a second operational amplifier having a first input coupled to the output node, a second input coupled to the reference voltage node, and an output coupled to a second node; an output transistor coupled between the output node and a ground node, the output transistor including a gate; first, second, and third stacked transistor pairs each serially coupled between the output node and the ground node, each transistor of the first, second, and third stacked transistor pairs including a gate; and switch circuits configured to selectively couple: the gates of the first and second stacked transistor pairs to the second node; and the gate of the output transistor to the first node.

In another example, a method of voltage regulation includes controlling voltage of an output node using a bias circuit, wherein an output transistor is coupled between the output node and a ground node, the output transistor including a gate, and wherein first, second, and third stacked transistor pairs are each serially coupled between the output node and the ground node, each transistor of the first, second, and third stacked transistor pairs including a gate; controlling voltage of a first node using an first operational amplifier that compares the voltage of the output node with a reference voltage; controlling voltage of a second node using a second operational amplifier that compares the voltage of the output node with the reference voltage; and controlling switch circuits that selectively couple: the gates of the first and second stacked transistor pairs to the second node; and the gate of the output transistor to the first node.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
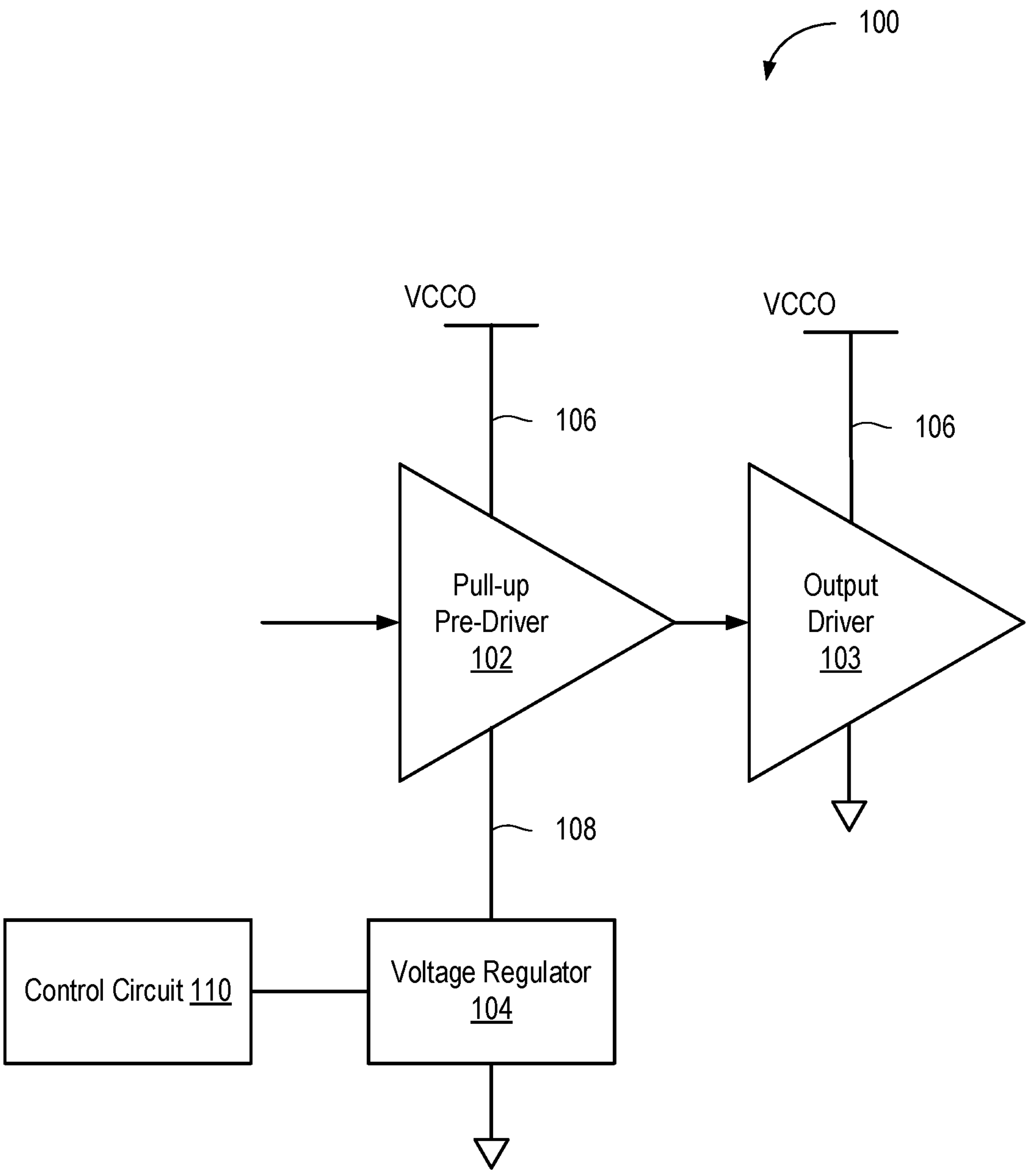
FIG. 1 is a block diagram depicting a transmitter according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques for providing a programmable reference voltage regulator are described. In an example, a voltage regulator includes a bias circuit coupled to an output node, a first operational amplifier having a first input coupled to the output node, a second input coupled to a reference voltage node, and an output coupled to a first node. The voltage regulator includes a second operational amplifier having a first input coupled to the output node, a second input coupled to the reference voltage node, and an output coupled to a second node. The voltage regulator includes an output transistor coupled between the output node and a ground node. The output transistor includes a gate; first, second, and third stacked transistor pairs each serially coupled between the output node and the ground node, each transistor of the first, second, and third stacked transistor pairs including a gate; and switch circuits configured to selectively couple: the gates of the first and second stacked transistor pairs to the second node; and the gate of the output transistor to the first node. The voltage regulator is programmable and supports a wide range of supply voltages. The voltage regulator also provides a "regulated ground" voltage and can sink current from an external circuit, such as a pre-driver. These and further aspects are described below with respect to the drawings.

FIG. 1 is a block diagram depicting a transmitter 100 according to an example. The transmitter 100 includes a pre-driver 102, an output driver 103, a voltage regulator 104, and a control circuit 110. The pre-driver 102 is coupled between two nodes 106 and 108. The node 106 is coupled to a voltage source VCCO. The node 108 is coupled to an output of the voltage regulator 104. Control inputs of the voltage regulator 104 are coupled to the control circuit 110. The voltage regulator 104 provides a regulated "ground" voltage level for the pre-driver 102. The voltage regulator 104 generates the regulated output voltage from VCCO. The voltage regulator 104 is programmable, by the control circuit 110, to operate given various VCCO voltages. By programming the voltage regulator 104 accordingly, the voltage swing of the pre-driver 102 can be substantially constant across different VCCO domains. The skew of the pre-driver's propagation delay across multiple VCCO domains can be minimized. Output of the pre-driver 102 is coupled to input of the output driver 103. The output driver 103 is coupled between VCCO and electrical ground.

Figure 2:
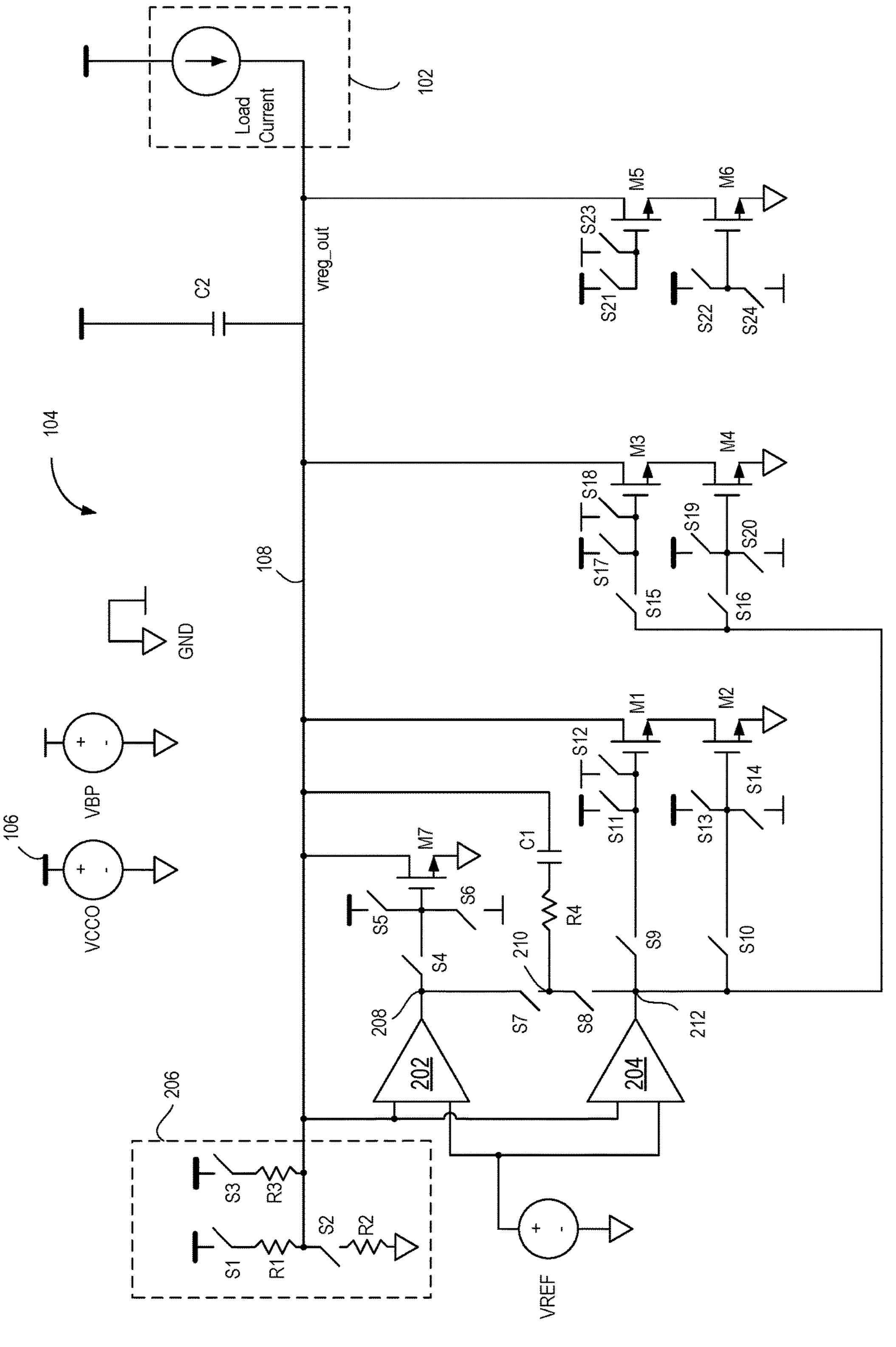
FIG. 2 is a schematic diagram depicting a voltage regulator according to an example.

FIG. 2 is a schematic diagram depicting the voltage regulator 104 according to an example. The voltage regulator 104 includes an operational amplifier 202, an operational amplifier 204, a bias circuit 206, transistors M1 through M7, switches S4 through S24, a resistor R4, and capacitors C1 and C2. In the example, the bias circuit 206 includes switches S1 through S3 and resistors R1 through R3.

Inputs of the operational amplifier 202 are coupled to the node 108 (also referred to as the output node 108) and a reference voltage node (VREF). Likewise, inputs of the operational amplifier 204 are coupled to the output node 108 and the reference voltage node (VREF). An output of the operational amplifier 202 is coupled to a node 208, and an output of the operational amplifier 204 is coupled to a node 212.

In the example, the transistors M1 through M7 are N-channel field effect transistors (FETs), such as n-type metal oxide semiconductor FETs (MOSFETS or "NMOS"). The transistor M7 is also referred to as the "output transistor" and can include a thicker gate oxide than the transistors M1 through M6. A drain of the transistor M7 is coupled to the output node 108. A source of the transistor M7 is coupled to electrical ground. A gate of the transistor M7 is coupled to switches S4, S5, and S6. The switch S4 selectively couples the gate of the transistor M7 to the node 208. The switch S5 selectively couples the gate of the transistor M7 to the node VCCO. The switch S6 selectively couples the gate of the transistor M7 to a ground node.

The resistor R4 is coupled in series with the capacitor C1. The series combination of the resistor R4 and the capacitor C1 is coupled between the output node 108 and the node 210. The node 210 is coupled to the switches S7 and S8. The switch S7 selectively couples the node 210 to the node 208. The switch S8 selectively couples the node 210 to the node 212. The capacitor C2 is coupled between the voltage node VCCO and the output node 108.

The transistors M1 and M2 comprise a first stacked transistor pair (M1, M2). In the stacked transistor pair (M1, M2), the transistor M1 is referred to as the "top" transistor and the transistor M2 is referred to as the bottom transistor. A drain of the transistor M1 is coupled to the output node 108. A source of the transistor M1 is coupled to a drain of the transistor M2. A source of the transistor M2 is coupled to electrical ground. A gate of the transistor M1 is coupled to the switches S9, S11, and S12. A gate of the transistor M2 is coupled to the switches S10, S13, and S14. The switch S12 selectively couples the gate of the transistor M1 to a voltage node VBP. The switch S11 selectively couples the gate of the transistor M1 to the voltage node VCCO. The switch S9 selectively couples the gate of the transistor M1 to the node 212. The switch S13 selectively couples the gate of the transistor M2 to the voltage node VCCO. The switch S10 selectively couples the gate of the transistor M2 to the node 212. The switch S14 selectively couples the gate of the transistor M2 to the ground node.

The transistors M3 and M4 comprise a second stacked transistor pair (M3, M4). In the stacked transistor pair (M3, M4), the transistor M3 is referred to as the "top" transistor and the transistor M4 is referred to as the bottom transistor. A drain of the transistor M3 is coupled to the output node 108. A source of the transistor M3 is coupled to a drain of the transistor M4. A source of the transistor M4 is coupled to electrical ground. A gate of the transistor M3 is coupled to the switches S15, S17, and S18. A gate of the transistor M4 is coupled to the switches S16, S19, and S20. The switch S18 selectively couples the gate of the transistor M3 to a voltage node VBP. The switch S17 selectively couples the gate of the transistor M3 to the voltage node VCCO. The switch S15 selectively couples the gate of the transistor M3 to the node 212. The switch S19 selectively couples the gate of the transistor M4 to the voltage node VCCO. The switch S16 selectively couples the gate of the transistor M4 to the node 212. The switch S20 selectively couples the gate of the transistor M4 to the ground node.

The transistors M5 and M6 comprise a third stacked transistor pair (M5, M6). In the stacked transistor pair (M5, M6), the transistor M5 is referred to as the "top" transistor and the transistor M6 is referred to as the bottom transistor. A drain of the transistor M5 is coupled to the output node 108. A source of the transistor M5 is coupled to a drain of the transistor M6. A source of the transistor M6 is coupled to electrical ground. A gate of the transistor M5 is coupled to the switches S21 and S23. A gate of the transistor M6 is coupled to the switches S22 and S24. The switch S23 selectively couples the gate of the transistor M5 to a voltage node VBP. The switch S21 selectively couples the gate of the transistor M5 to the voltage node VCCO. The switch S22 selectively couples the gate of the transistor M6 to the voltage node VCCO. The switch S24 selectively couples the gate of the transistor M6 to the ground node.

The resistor R1 is coupled between the switch S1 and the output node 108. The switch S1 selectively couples the resistor R1 to the voltage node VCCO. The resistor R3 is coupled between the switch S3 and the output node 108. The switch S3 selectively couples the resistor R3 to the voltage node VCCO. The resistor R2 is coupled between electrical ground and the switch S2. The switch S2 selectively couples the resistor R2 to the output node 108.

In operation, the voltage regulator 104 provides a "regulated ground" and consumes current from a load, such as the pre-driver 102 shown in FIG. 1. The voltage regulator 104 also supports a wide range of VCCO levels. In a non-limiting example, the voltage regulator 104 can operate using a VCCO ranging between 0.6 V to 1.8 V. The bias circuit 206 serves two functions. During a power-up mode, the bias circuit 206 provides a voltage level that ensures there is no electrical overstress to the transistors M1 through M6. In a specific example, the highest nominal VCCO voltage is 1.8 V. For a core transistor produced by a 16 nm manufacturing process, a maximum overstress voltage is on the order of 1.05 V. A core transistor can encounter electrical overstress (EOS) damage if any of its Vds, Vgs, or Vdg voltages is above the 1.05 V limit. Thus, in an example, the bias circuit 206 supplies ½*VCCO to the output node 108 during power-up, which is less than 1.05 V. The bias circuit 206 can supply other voltages to the output node 108 during power-up depending on the maximum overstress voltage of the transistors. During normal operation mode, the bias circuit 206 is configured to source some leakage current to ensure the stability of the voltage regulator 104 in case there is no current supplied by the load.

For the bias circuit 206 shown in FIG. 2, the switches S1 and S2 are closed, and the switch S3 is open, during the power-up mode. The resistors R1 and R2 divide VCCO to supply a voltage to the output node 108. If the resistors R1 and R2 are equal, then the bias circuit 206 supplies ½*VCCO to the output node 108. Other ratios of R1 to R2 are possible to generate other fractions of VCCO. In normal operation, the switch S2 is open and the switches S1 and/or S3 can be closed to provide a source of leakage current. In some normal operation modes, the switches S1 and S3 can also be open in case a source of leakage current is not required.

As described above, the voltage regulator 104 includes two operational amplifiers 202 and 204. The operational amplifier 202 is used when VCCO is a "high voltage," and the operational amplifier 204 is used when VCCO is a "low voltage." For example, the operational amplifier 202 is used when VCCO is 1.8 V, and the operational amplifier 204 is used when VCCO is 1-1.5 V. In an example, neither of the operational amplifiers 202 and 204 are used when VCCO is 0.6 V. The switches S4, S7, S8, S9, S10, S15, and S16 are controlled to enable use of the operational amplifier 202, the operational amplifier 204, or neither of them. If all switches S4, S7, S8, S9, S10, S15, and S16 are open, then neither of the operational amplifiers 202, 204 are used. If the switches S4 and S7 are closed and the switches S8, S9, S10, S15, and S16 are open, then the operational amplifier 202 is used. If the switches S4 and S7 are open and the switches S8, either or both S9 and S10, or both S15 and S16 are closed, then the operational amplifier 204 is used. Each operational amplifier 202 and 204 compares the output voltage (vreg_out) on the output node 108 with the reference voltage VREF. When used, the operational amplifier 202 adjusts the gate bias of the transistor M7 to drive the voltage vreg_out to VREF. When used, the operational amplifier 204 adjusts the gate bias of the transistors M1 through M4 to ensure that vreg_out is equal to VREF.

The resistor R4 and the capacitor C1 are used to improve the closed loop phase margin. Since the capacitor C1 can consume a large implementation area, the capacitor C1 is shared between the operational amplifiers 202 and 204. When the operational amplifier 202 is selected, the switch S7 is closed and the switch S8 is opened. On the other hand, when the operational amplifier 204 is selected, the switch S7 is open and the switch S8 is closed. The resistor R4 and the capacitor C1 are sized to meet both of the operational amplifiers' 202 and 204 phase margin requirements to ensure robustness of the design.

The input reference voltage, VREF, sets the output voltage vreg_out. The reference voltage level is programmable based on the specific VCCO level. In an example, the voltage regulator 104 is controlled to maintain a substantially constant voltage swing of the pre-driver 102 across multiple VCCO levels. In an example, the reference voltage VREF is set to VCCO−Vswing, where Vswing is the voltage swing of the pre-driver 102. The reference voltage can be generated using a resistor divider circuit or using any other type of circuit for generating a reference voltage from VCCO.

The transistors M1 through M6 are stacked to ensure no electrical overstress when the voltage regulator 104 is operated with a high VCCO level (e.g., 1.8 V). To turn off the stacked transistors safely, the gate voltage of the top transistors in the stacked transistor pairs are biased at VBP while the gate voltage of the bottom transistors are biased at electrical ground. The voltage VBP is programmable based on the specific VCCO level. Table 1 shows an example configuration of the voltage regulator 104 based on the given range of VCCO.

TABLE 1

| VCCO (V) | VREF (V) | vreg_out (V) | Vswing (V) | VBP (V) | Op Amp |
|---|---|---|---|---|---|
| 1 | 0.4 * VCCO | 0.4 | 0.6 | 0 | LV |
| 1.2 | 0.5 * VCCO | 0.6 | 0.6 | 0.2 | LV |
| 1.35 | 0.55 * VCCO | 0.74 | 0.61 | 0.35 | LV |
| 1.5 | 0.6 * VCCO | 0.9 | 0.6 | 0.5 | LV |
| 1.8 | 0.65 * VCCO | 1.17 | 0.63 | 0.8 | HV |
| 0.6 | VCCO | 0 | 0.6 | 0 | Both off |

As shown in the example of Table 1, the low voltage (LV) operational amplifier 204 is selected for VCCO between 1 and 1.5 V. When VCCO is 1.8 V, the operational amplifier 202 is selected. For VCCO of 0.6 V, neither of the operational amplifiers 202, 204 is selected. VREF is adjusted along with VCCO in order to maintain a substantially constant Vswing of 0.6. As VCCO increases, vreg_out increases to maintain the substantially constant swing. Also, as VCCO increases, VBP increases to operate the transistors safely.

The configuration of the switches S1-S24 depends on the particular operation mode and the value of VCCO. The control circuit 110 is configured to control the switches S1-S24. In the power-up mode, the control circuit 110 closes switches S1, S2, S6, S12, S14, S18, S20, S23, and S24, and opens switches S3, S4, S5, S7, S8, S9, S10, S11, S13, S15, S16, S17, S19, S21, and S22. The control circuit 110 can implement various normal operating modes depending on the value of VCCO.

Continuing with the example of Table 1, for a VCCO of 1.0 V, vreg_out=VCCO−Vswing=0.4 V. VBP is set to be 0 V. The control circuit 110 closes switches S1 and S3 of the bias circuit 206. The control circuit 110 also closes switches S8, S9, S10, S15, and S16 to couple the node 212 to the gates of the transistors M1 through M4 and to the node 210. The switches S4 and S7 remain open. The control circuit 110 closes the switch S6 and leaves open the switch S5 so that a ground voltage is applied to the gate of the transistor M7. The control circuit 110 controls all of switches S11, S12, S13, S14, S17, S18, S19, and S20 to be open so that the operational amplifier 204 drives the gates of the transistors M1 through M4. The control circuit 110 closes the switches S23 and S24 to apply the voltage VBP to the gate of the transistor M5 and the ground voltage to the gate of the transistor M6. The switches S21 and S22 remain open.

For a VCCO between 1.2 and 1.5V, the control circuit 110 sets VBP to VCCO−1V. The control circuit 110 closes switches S1 and S3 of the bias circuit 206. The control circuit 110 also closes switches S8, S9, and S10 to couple the node 212 to the gates of the transistors M1 through M2 and to the node 210. The switches S4 and S7 remain open. The control circuit 110 closes the switch S6 and leaves open the switch S5 so that a ground voltage is applied to the gate of the transistor M7. The control circuit 110 controls all of switches S11, S12, S13, and S14 to be open so that the operational amplifier 204 drives the gates of the transistors M1 through M2. The control circuit 110 opens the switches S15, S16, S17, and S19, and closes the switches S18 and S20. Thus, the control circuit 110 couples the voltage VBP to the gate of the transistor M3, and the ground voltage to the transistor M4. The control circuit 110 closes the switches S23 and S24 to apply the voltage VBP to the gate of the transistor M5 and the ground voltage to the gate of the transistor M6. The switches S21 and S22 remain open.

For a VCCO of 1.8 V, the control circuit 110 sets VBP to VCCO−1V. The control circuit 110 closes switches S1 and S3 of the bias circuit 206. In this case, the operational amplifier 202 is selected in favor of the operational amplifier 204. Thus, the control circuit 110 closes the switches S4 and S7 and opens the switches S8, S9, S10, S15, and S16. The control circuit 110 also opens the switches S5 and S6 so that the output voltage of the operational amplifier 202 drives the gate of the transistor M7. The control circuit 110 opens the switches S11 and S13 and closes the switches S12 and S14 to drive the gate of the transistor M1 with VBP and the gate of the transistor M2 with the ground voltage. The control circuit 110 closes the switches S18 and S20 and opens the switches S17 and S19 to drive the gate of the transistor M3 with VBP and the gate of the transistor M4 with the ground voltage. The control circuit 110 opens the switches S21 and S22 and closes the switches S23 and S24 to drive the gate of the transistor M5 with VBP and the gate of the transistor M6 with the ground voltage.

For a VCCO of 0.6 V, the control circuit 110 sets VBP to 0V and controls the output node 108 to be 0 V. The control circuit 110 opens the switches S1 through S3 of the bias circuit 206. The control circuit 110 opens the switches S4, S7, S8, S9, S10, S15, and S16 to disable both of the operational amplifiers 202 and 204. The control circuit 110 closes the switch S5 and opens the switch S6 to drive the gate of the transistor M7 with the voltage VCCO. The control circuit 110 closes the switches S11, S13, S17, S19, S21, and S22, and opens the switches S12, S14, S18, S20, S23, and S24. Thus, the gates of the transistors M1 through M6 are driven with the voltage VCCO.

In general, the output voltage vreg_out decreases as the voltage regulator 104 is operated at lower VCCO levels. Lower output voltage vreg_out reduces the transistor stacks' drive current capacity. Thus, more transistor stacks are needed to sink the load current to electrical ground at lower VCCO levels. At VCCO of 0.6 V, both of the operational amplifiers 202 and 204 are disabled, since the desired vreg_out is 0V. All of the transistors M1 through M7 are on to sink the load current to electrical ground.

Figure 3:
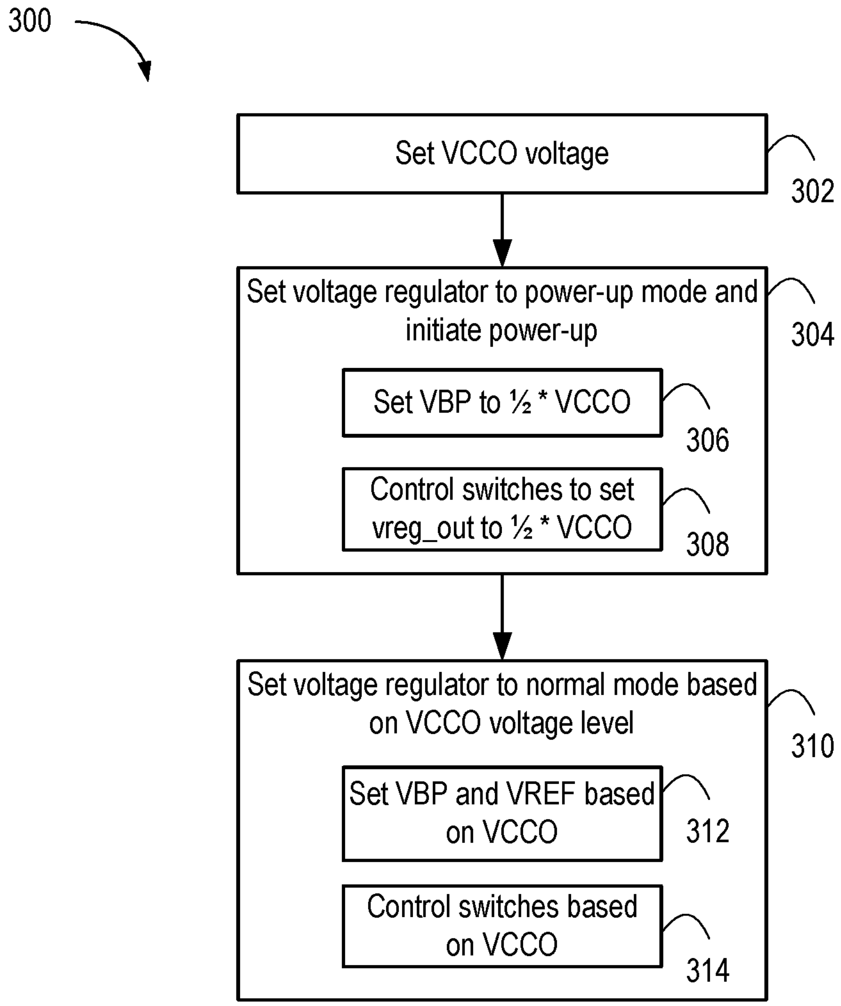
FIG. 3 is a flow diagram depicting a method of controlling a voltage regulator according to an example.

FIG. 3 is a flow diagram depicting a method 300 of controlling the voltage regulator 104 according to an example. At step 302, an external circuit sets the VCCO voltage for use by the voltage regulator 104. At step 304, the control circuit 110 sets the voltage regulator 104 to the power-up mode and initiates power-up. For example, at step 306, the control circuit 110 sets VBP to ½*VCCO or some other voltage in order to avoid overstress of the transistors M1 through M7. At step 308, the control circuit 110 controls the switches S1-S24 to set vreg_out to ½*VCCO, as described above. At step 310, the control circuit 110 sets the voltage regulator 104 to normal mode based on the VCCO level. For example, at step 312, the control circuit 110 sets VBP and VREF based on VCCO. For example, the control circuit 110 can set VBP and VREF as shown in Table 1 above. At step 314, the control circuit 110 controls the switches S1-S24 based on the VCCO level, as described above.

Figure 4:
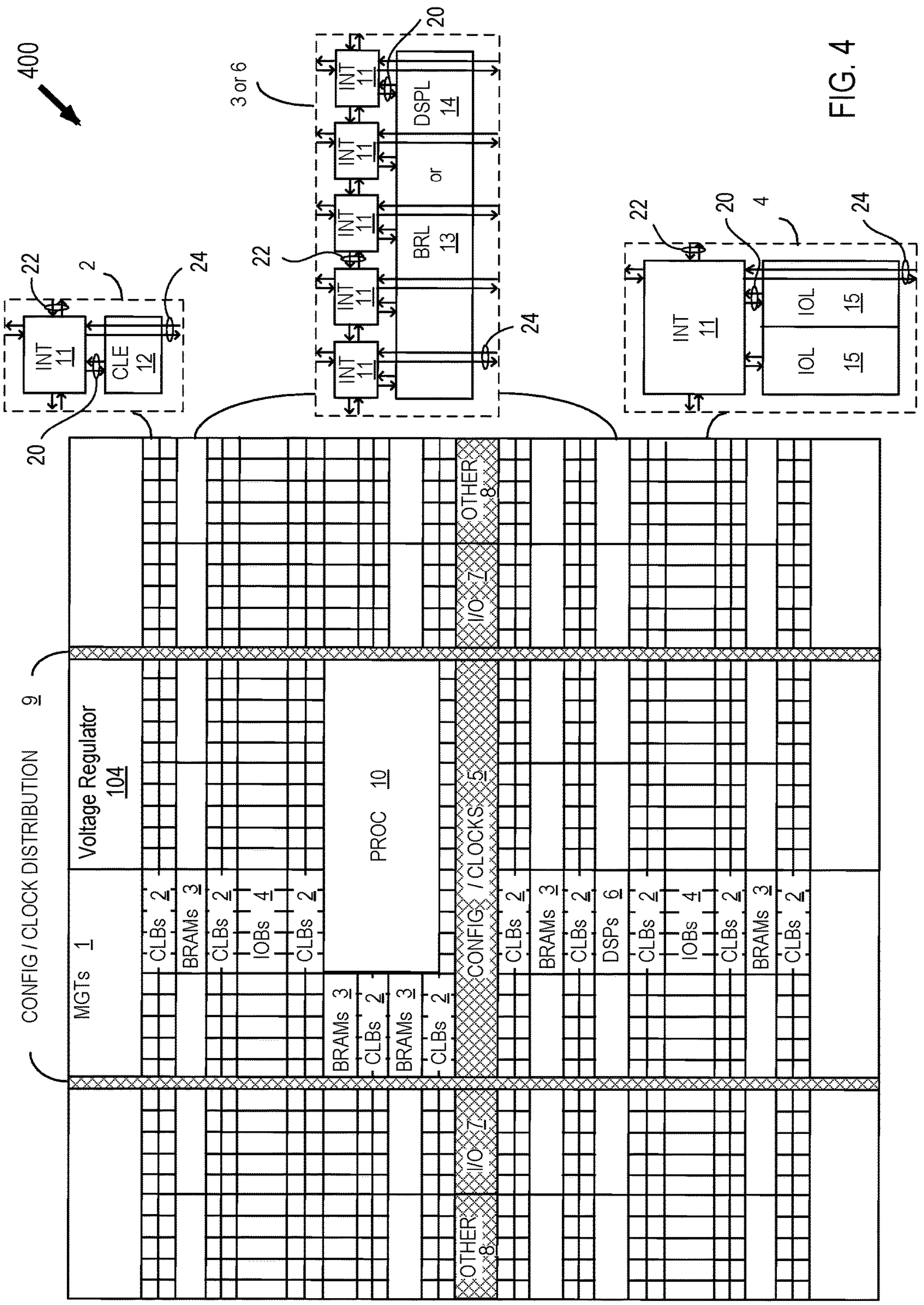
FIG. 4 illustrates an architecture of a field programmable gate array (FPGA) in which the voltage regulator described herein can be employed.

In an example, the voltage regulator 104 can be used in a programmable integrated circuit (IC), such as a field programmable gate array (FPGA). The voltage regulator 104 can be used to provide a regulated ground voltage to drivers in transmitters of the FPGA. FIG. 4 illustrates an architecture of an FPGA 400 that includes a large number of different programmable tiles including multi-gigabit transceivers ("MGTs") 1, configurable logic blocks ("CLBs") 2, random access memory blocks ("BRAMs") 3, input/output blocks ("IOBs") 4, configuration and clocking logic ("CONFIG/CLOCKS") 5, digital signal processing blocks ("DSPs") 6, specialized input/output blocks ("I/O") 7 (e.g., configuration ports and clock ports), and other programmable logic 8 such as digital clock managers, analog-to-digital converters, system monitoring logic, and so forth. Some FPGAs also include dedicated processor blocks ("PROC") 10. The FPGA 400 can be used as the programmable IC 118 shown in FIG. 1. In such case, the layer circuit(s) 120 are implemented using the programmable fabric of the FPGA 400.

In some FPGAs, each programmable tile can include at least one programmable interconnect element ("INT") 11 having connections to input and output terminals 20 of a programmable logic element within the same tile, as shown by examples included at the top of FIG. 4. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An 10B 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die (shown in FIG. 11) is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 4 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

Note that FIG. 4 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 4 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A voltage regulator, comprising:

a bias circuit coupled to an output node;

a first operational amplifier having a first input coupled to the output node, a second input coupled to a reference voltage node, and an output coupled to a first node;

a second operational amplifier having a first input coupled to the output node, a second input coupled to the reference voltage node, and an output coupled to a second node;

an output transistor coupled between the output node and a ground node, the output transistor including a gate;

first, second, and third stacked transistor pairs each serially coupled between the output node and the ground node, each transistor of the first, second, and third stacked transistor pairs including a gate; and switch circuits configured to selectively couple: the gates of the first and second stacked transistor pairs to the second node; and the gate of the output transistor to the first node.

2. The voltage regulator of claim 1, wherein the switch circuits are further configured to selectively couple: a first voltage node to the gates of the output transistor and each transistor of the first, second, and third stacked transistor pairs; a second voltage node to gates of top transistors in each of the first, second, and third stacked transistor pairs; and a ground voltage node to the gates of the output transistor and bottom transistors in each of the first, second, and third stacked transistor pairs.

3. The voltage regulator of claim 2, wherein the first voltage node is coupled to a first voltage source, the second voltage node is coupled to a second voltage source, and the ground node is coupled to an electrical ground.

4. The voltage regulator of claim 1, further comprising:

a capacitor and a resistor coupled in series between the output node and a third node;

wherein the switch circuits are further configured to selectively couple the third node to the first node or the second node.

5. The voltage regulator of claim 1, further comprising:

a capacitor coupled between a first voltage node and the output node.

6. The voltage regulator of claim 1, wherein the bias circuit comprises a resistor divider circuit coupled between a first voltage node and a ground node.

7. The voltage regulator of claim 1, wherein the output transistor includes a thicker gate oxide than the transistors of the first, second, and third stacked transistor pairs.

8. A transmitter, comprising:

a pre-driver coupled between a first voltage node and a regulated ground voltage node; and a voltage regulator having an output node coupled to regulated ground voltage node, the voltage regulator including:

a bias circuit coupled to the output node;

a first operational amplifier having a first input coupled to the output node, a second input coupled to a reference voltage node, and an output coupled to a first node;

a second operational amplifier having a first input coupled to the output node, a second input coupled to the reference voltage node, and an output coupled to a second node;

an output transistor coupled between the output node and a ground node, the output transistor including a gate;

first, second, and third stacked transistor pairs each serially coupled between the output node and the ground node, each transistor of the first, second, and third stacked transistor pairs including a gate; and switch circuits configured to selectively couple: the gates of the first and second stacked transistor pairs to the second node; and the gate of the output transistor to the first node.

9. The transmitter of claim 8, wherein the switch circuits are further configured to selectively couple: the first voltage node to the gates of the output transistor and each transistor of the first, second, and third stacked transistor pairs; a second voltage node to gates of top transistors in each of the first, second, and third stacked transistor pairs; and a ground voltage node to the gates of the output transistor and bottom transistors in each of the first, second, and third stacked transistor pairs.

10. The transmitter of claim 9, wherein the first voltage node is coupled to a first voltage source, the second voltage node is coupled to a second voltage source, and the ground node is coupled to an electrical ground.

11. The transmitter of claim 8, further comprising:

a capacitor and a resistor coupled in series between the output node and a third node;

wherein the switch circuits are further configured to selectively couple the third node to the first node or the second node.

12. The transmitter of claim 8, further comprising:

a capacitor coupled between a first voltage node and the output node.

13. The transmitter of claim 8, wherein the bias circuit comprises a resistor divider circuit coupled between a first voltage node and a ground node.

14. The transmitter of claim 8, wherein the output transistor includes a thicker gate oxide than the transistors of the first, second, and third stacked transistor pairs.

15. A method of voltage regulation, comprising:

controlling voltage of an output node using a bias circuit, wherein an output transistor is coupled between the output node and a ground node, the output transistor including a gate, and wherein first, second, and third stacked transistor pairs are each serially coupled between the output node and the ground node, each transistor of the first, second, and third stacked transistor pairs including a gate;

controlling voltage of a first node using an first operational amplifier that compares the voltage of the output node with a reference voltage;

controlling voltage of a second node using a second operational amplifier that compares the voltage of the output node with the reference voltage; and controlling switch circuits that selectively couple: the gates of the first and second stacked transistor pairs to the second node; and the gate of the output transistor to the first node.

16. The method of claim 15, wherein the switch circuits are further configured to selectively couple: a first voltage node to the gates of the output transistor and each transistor of the first, second, and third stacked transistor pairs; a second voltage node to gates of top transistors in each of the first, second, and third stacked transistor pairs; and a ground voltage node to the gates of the output transistor and bottom transistors in each of the first, second, and third stacked transistor pairs.

17. The method of claim 16, wherein the first voltage node is coupled to a first voltage source, the second voltage node is coupled to a second voltage source, and the ground node is coupled to an electrical ground.

18. The method of claim 16, wherein the step of controlling the switch circuits includes:

controlling, in a power-up mode, the switch circuits to: couple the gate of the output transistor to the ground node; the gates of the top transistors to the second voltage node; and the gates of the bottom transistors to the ground node.

19. The method of claim 16, wherein the step of controlling the switch circuits includes:

controlling the switch circuits to: couple the gate of the output transistor to the ground node; the gates of the transistors in the first and second stacked transistor pairs to the second node; the gate of the top transistor in the third stacked transistor pair to the second voltage node; and the gate of the bottom transistor in the third stacked transistor pair to the ground node.

20. The method of claim 16, wherein the step of controlling the switch circuits includes:

controlling the switch circuits to: couple the gate of the output transistor to the first node; the gates of the top transistors to the second voltage node; and the gates of the bottom transistors to the ground node.

* * * * *